United States Patent
Wang et al.

(10) Patent No.: US 11,894,006 B2
(45) Date of Patent: Feb. 6, 2024

(54) COMPRESSOR TARGET CURVE TO AVOID BOOSTING NOISE

(71) Applicant: DOLBY LABORATORIES LICENSING CORPORATION, San Francisco, CA (US)

(72) Inventors: Zhongjin Wang, Beijing (CN); Andrew Peter Reilly, Hurlstone Park (AU); Michael William Mason, Wahroonga (AU)

(73) Assignee: DOLBY LABORATORIES LICENSING CORPORATION, San Francisco, CA (US)

( * ) Notice: Subject to any disclaimer, the term of this patent is extended or adjusted under 35 U.S.C. 154(b) by 154 days.

(21) Appl. No.: 17/263,020

(22) PCT Filed: Jul. 18, 2019

(86) PCT No.: PCT/CN2019/096535
§ 371 (c)(1),
(2) Date: Jan. 25, 2021

(87) PCT Pub. No.: WO2020/020043
PCT Pub. Date: Jan. 30, 2020

(65) Prior Publication Data
US 2021/0233548 A1    Jul. 29, 2021

Related U.S. Application Data

(60) Provisional application No. 62/703,023, filed on Jul. 25, 2018.

(51) Int. Cl.
*G10L 15/00* (2013.01)
*G10L 19/00* (2013.01)
(Continued)

(52) U.S. Cl.
CPC ........ *G10L 19/265* (2013.01); *G10L 21/0208* (2013.01); *G10L 21/0232* (2013.01)

(58) Field of Classification Search
CPC ........ G10L 15/00; G10L 19/00; G10L 19/167
See application file for complete search history.

(56) References Cited

U.S. PATENT DOCUMENTS

| 8,144,881 B2 | 3/2012 | Crockett |
| 8,437,482 B2 | 5/2013 | Seefeldt |
| (Continued) | | |

FOREIGN PATENT DOCUMENTS

| CN | 105144289 | 12/2015 |
| CN | 105556837 | 5/2016 |
| (Continued) | | |

OTHER PUBLICATIONS

Mason, A. et al "Adaptive Audio Reproduction Using Personalised Compression" AES 57th International Conference, Mar. 6-8, 2015, pp. 1-7.

*Primary Examiner* — Shreyans A Patel

(57) ABSTRACT

The processing of audio signals during playback is provided, so that audio signals that fall below a specified threshold loudness level are processed to avoid making unwanted background noise audible. N-channel audio is received from a playback volume controller/leveler (101). The level of the audio is compared with a threshold level. If the level is greater than the threshold level, the audio is processed with a first amount of gain in accordance with a first dynamic range control (DRC) compression curve that is tuned for professionally produced audio. If the level is less than or equal to the threshold level, the audio is processed with a second amount of gain in accordance with a second DRC compression curve that is designed to avoid boosting (Continued)

unwanted background noise. After applying the gain to the audio, the audio is sent to a downstream device.

20 Claims, 8 Drawing Sheets

(51) Int. Cl.
  *G10L 19/26* (2013.01)
  *G10L 21/0208* (2013.01)
  *G10L 21/0232* (2013.01)

(56) References Cited

U.S. PATENT DOCUMENTS

| | | | |
|---|---|---|---|
| 9,749,741 B1 * | 8/2017 | Yang | H04R 3/007 |
| 10,466,959 B1 * | 11/2019 | Yang | H03G 7/002 |
| 2002/0173865 A1 | 11/2002 | Frindle | |
| 2005/0135635 A1 | 6/2005 | Prince | |
| 2008/0069385 A1 | 3/2008 | Revit | |
| 2009/0274310 A1 | 11/2009 | Taenzer | |
| 2010/0121635 A1 | 5/2010 | Erell | |
| 2010/0318353 A1 | 12/2010 | Bizjak | |
| 2016/0191007 A1 | 6/2016 | Li | |
| 2016/0211817 A1 * | 7/2016 | Krishnaswamy | H03G 3/02 |
| 2016/0351202 A1 | 12/2016 | Baumgarte | |
| 2017/0249951 A1 | 8/2017 | Koppens | |
| 2018/0033427 A1 * | 2/2018 | Kwon | G10L 15/063 |
| 2021/0233548 A1 * | 7/2021 | Wang | G10L 19/265 |

FOREIGN PATENT DOCUMENTS

| | | | | |
|---|---|---|---|---|
| CN | 105493182 B | * | 1/2020 | G10L 19/008 |
| CN | 110679083 A | * | 1/2020 | G10L 19/167 |
| CN | 106796799 B | * | 6/2021 | G10L 19/167 |
| EP | 2648424 A2 | * | 10/2013 | H04R 25/356 |
| EP | 3579081 A1 | * | 12/2019 | G06F 3/016 |
| EP | 3574583 B1 | * | 12/2020 | G10L 19/167 |
| JP | H04365210 A | | 12/1992 | |
| JP | 4082745 B2 | * | 4/2008 | |
| JP | 5530720 B2 | * | 6/2014 | G10L 19/012 |
| JP | 6676047 B2 | * | 4/2020 | G10L 19/167 |
| WO | 2009011827 | | 1/2009 | |
| WO | 2010126709 | | 11/2010 | |
| WO | 2017058731 | | 4/2017 | |
| WO | WO-2018086972 A1 | * | 5/2018 | G16H 40/67 |

* cited by examiner

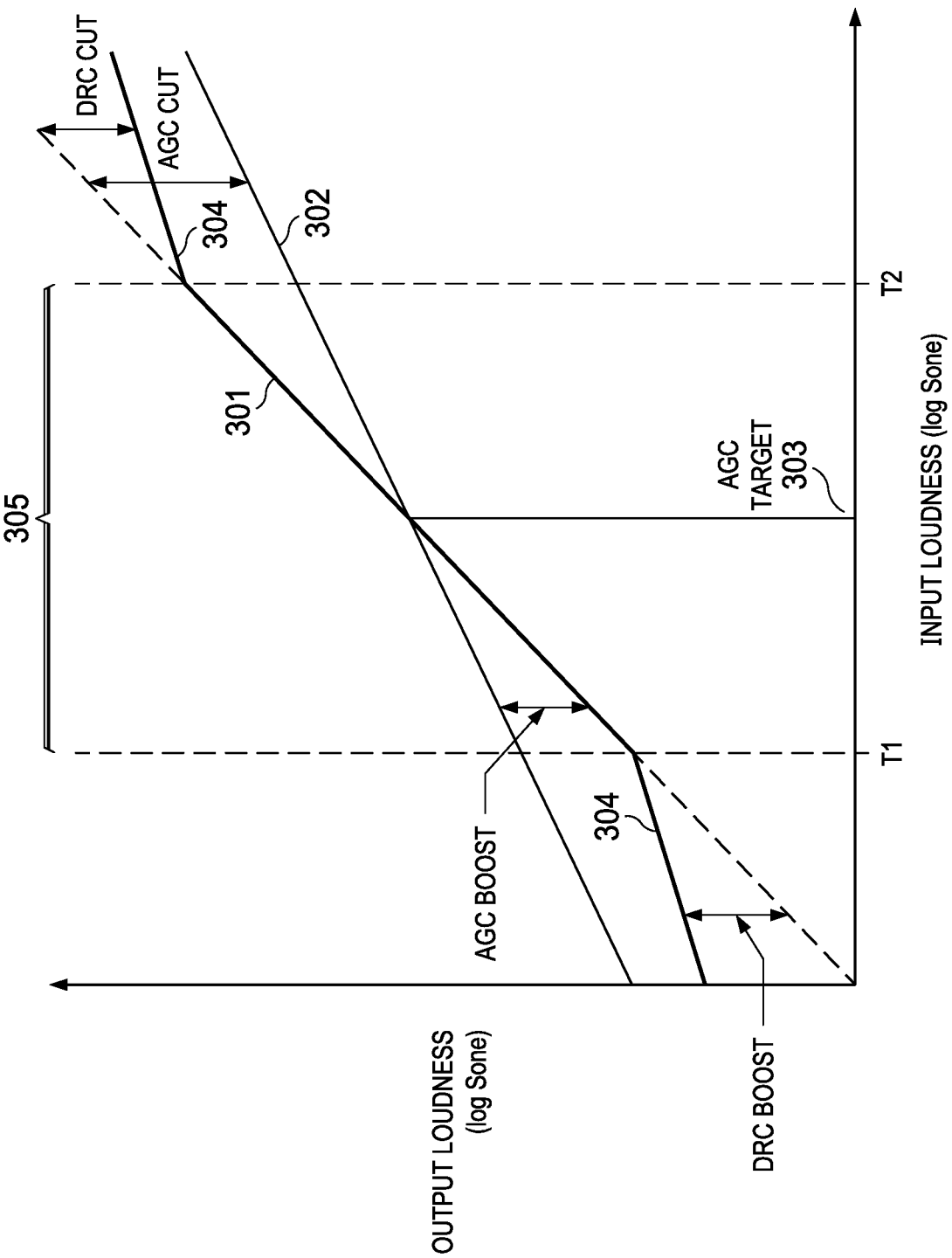

COMPRESSOR TARGET CURVE TO AVOID BOOSTING NOISE

CROSS-REFERENCE TO RELATED APPLICATIONS

This application claims priority to U.S. Provisional Patent Application No. 62/703,023, filed Jul. 25, 2018, which is hereby incorporated by reference in its entirety.

TECHNICAL FIELD

This specification relates to audio signal processing in general, and loudness control, automatic gain control (AGC) and dynamic range control (DRC) in particular.

BACKGROUND

The level and dynamic range of audio are affected by the recording processes of tracking, mixing, mastering and encoding. The level and dynamic range are also affected during playback by the listener's acoustic environment, ambient noise levels, quality of playback equipment and personal preferences of the listener.

SUMMARY

Embodiments disclosed herein are directed to the processing of audio signals during playback so that audio signals that fall below a specified threshold loudness level are processed to avoid making unwanted background noise audible.

In an embodiment, n-channel audio is received from a playback volume controller/leveler. The level of the audio is compared with a threshold level. If the level is greater than the threshold level, the audio is processed with a first amount of gain in accordance with a first dynamic range control (DRC) compression curve that is tuned for professionally produced audio. If the level is less than or equal to the threshold level, the audio is processed with a second amount of gain in accordance with a second DRC compression curve that is designed to avoid boosting unwanted background noise. After applying the gain to the audio, the audio is sent to a downstream device.

In an embodiment, an audio signal is received and the spectrum bands of the audio signal are determined. Skewing of the spectrum bands is determined and a noise floor of the audio signal is estimated based at least in part on the skewing. A noise possibility value is determined based at least in part on the skewing and an auditory scene analysis (ASA) event value. The ASA event value indicates a change in spectral content in one or more spectrum bands. The noise possibility value is used to determine if unwanted noise is present in the audio signal. In accordance with determining that unwanted noise is present in the audio signal, one or more parameters of at least one of automatic gain control (AGC) or dynamic range control (DRC) are adjusted, and at least one of the AGC or DRC is applied to the audio signal to avoid boosting the unwanted noise.

Particular embodiments disclosed herein provide one or more of the following advantages. The disclosed embodiments limit the AGC and/or DRC processing of n-channel audio provided by a playback volume controller/leveler so that compression boosting is not applied to signals below a specified threshold level. In an embodiment, the threshold level is set below the quietest signal level that professionally produced content could reasonably expect to be heard in a typical listening environment. Below that threshold level the target gain is zero (no boost). It is not necessary to actively remove signals below the threshold as they are not audible in the typical listening environment. The gain filtering and smoothing mechanisms that are part of the playback volume controller/leveler are not affected by the limiting of the DRC and AGC processing of the n-channel audio. The resulting output audio has an even and consistent volume with sonic balance and no audible side effects or unwanted background noise, regardless of whether the audio was professionally produced.

BRIEF DESCRIPTION OF DRAWINGS

Through the following detailed description with reference to the accompanying drawings, the above and other objectives, features and advantages of embodiments of the present disclosure will become more comprehensible. In the drawings, several example embodiments of the present disclosure will be illustrated in an example and non-limiting manner, wherein:

FIG. 3 is a plot of output loudness versus input loudness illustrating the effects of AGC and DRC on signal loudness, according to an embodiment.

DETAILED DESCRIPTION

Figure 1:
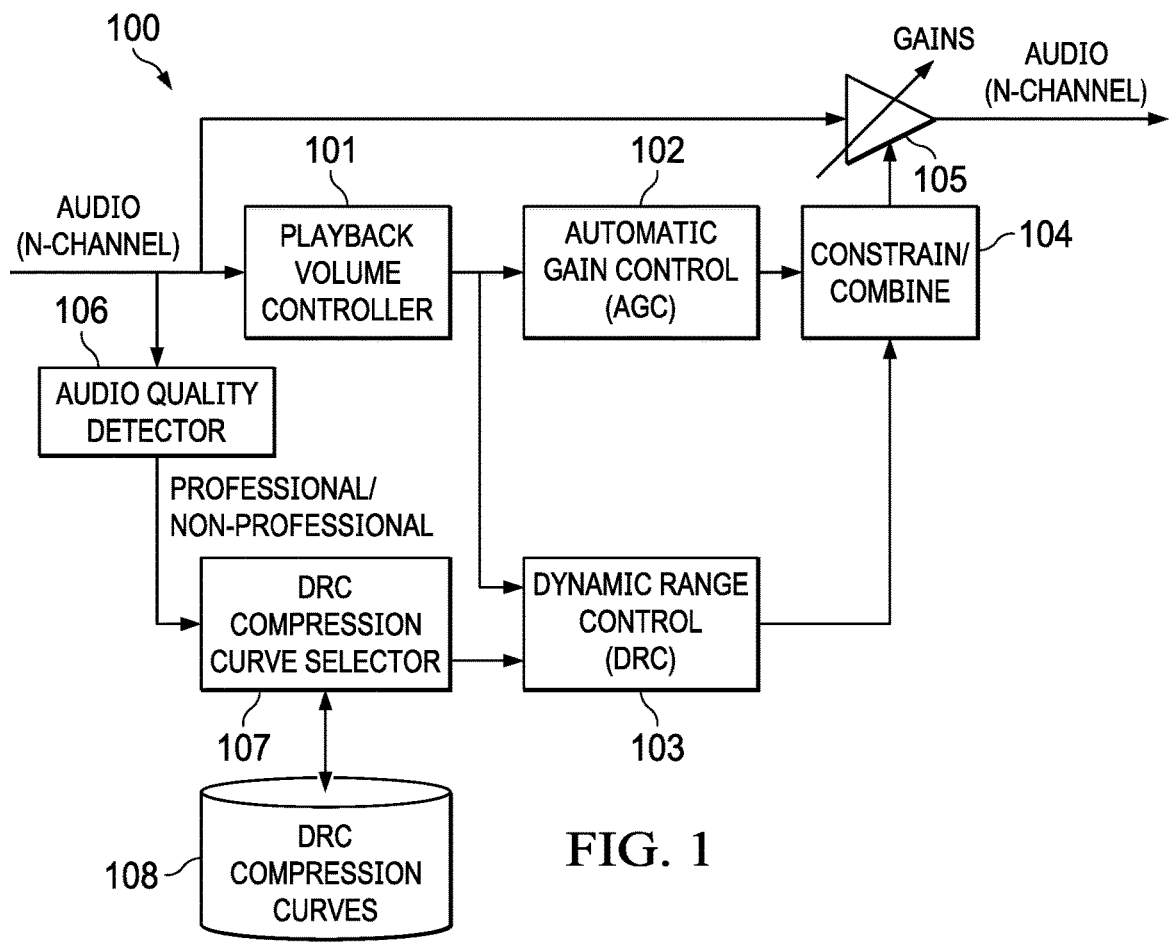
FIG. 1 is a block diagram of a playback volume controller/leveler system that avoids boosting unwanted noise, according to an embodiment.

Principles of the present disclosure will now be described with reference to various example embodiments illustrated in the drawings. It should be appreciated that depiction of these embodiments is only to enable those skilled in the art to better understand and further implement the present disclosure, not intended for limiting the scope of the present disclosure in any manner.

In the accompanying drawings, various embodiments of the present disclosure are illustrated in block diagrams, flow charts and other diagrams. Each block in the flowcharts or block may represent a module, a program, or a part of code, which contains one or more executable instructions for performing specified logic functions. Although these blocks are illustrated in particular sequences for performing the steps of the methods, they may not necessarily be performed strictly in accordance with the illustrated sequence. For example, they might be performed in reverse sequence or simultaneously, depending on the nature of the respective operations. It should also be noted that block diagrams and/or each block in the flowcharts and a combination of thereof may be implemented by a dedicated software-based or hardware-based system for performing specified functions/operations or by a combination of dedicated hardware and computer instructions.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Overview

In the audio recording environment, sounds are produced at a certain sound pressure level (SPL), and are recorded using microphones that have particular sensitivity characteristics that are frequency or direction specific. The signal level recorded by a microphone is also affected by the distance to the object making the sound. The signal level can be measured in terms of the peak value, but more commonly and practically it is recorded as SPL in decibels (dB) on a standardized scale (dB of SPL). On this logarithmic scale, 0 dB SPL or 20 µPa in air corresponds to the accepted threshold of human hearing. The upper limit at sea level is 191 dB SPL, atmospheric pressure, which would be deafening. A jet engine at 100 meters might be up to 140 dB SPL, for example. Normal conversation at 1 meter is usually around 40-60 dB SPL.

When multiple sounds are recorded in the same environment, or mixed together after being recorded separately, the difference in level between the quietest sounds and the loudest sounds is referred to as the dynamic range. The dynamic range of sounds that may be expected to be heard in a perfectly quiet environment is significantly larger than can comfortably be heard in many common listening environments, where speaker systems are not powerful enough to create extremely high sound pressure levels, and background ambient noise is not low enough to reveal the quieter sounds. Anything reproduced quieter than the ambient sound is masked by that sound.

Techniques of DRC, or dynamics processing, have been developed within the audio processing community over the years that make quieter sounds loud enough to hear in the listening environment, loud sounds quiet enough for comfort, prevent distortion in limited range speaker systems and ensures the average volume level is what the listener prefers. It is common to set the average volume level to the human dialog level, as the human dialog level is a stable reference volume level in most recording situations, and humans expect dialog to happen at a realistic level.

Dynamics processing has many difficulties, because human hearing is complicated and non-linear. The sense of loudness is frequency-dependent, and it has been observed that louder sounds will mask quieter sounds that are nearby in frequency. A particularly sophisticated and successful dynamics processing system in common use is Dolby Volume®, the details of which are described in, for example, U.S. Pat. Nos. 8,144,881 and 8,437,482.

Most dynamics processing systems, including Dolby Volume®, have been designed to process professionally made recordings that comprise cinema soundtracks or commercial music recordings. These recordings are generally carefully tracked, edited, processed and mastered before being delivered to the consumer as a finished recording. Every sound in these recordings is there deliberately, and the creators intended that the sounds be heard in an ideal listening environment, with ideal reproduction equipment. Consequently, when the audio is compressed, the lowest level recorded signals are boosted and the highest level recorded signals are reduced at the limit of the recording medium (referred to as "full scale").

A problem addressed by the disclosed embodiments is that it is increasingly common for users to reproduce sound recordings that have not been made with sensitive professional equipment, nor edited and mastered by professional sound engineers. A common characteristic of these signals is unwanted background noise. For example, when a movie actor is professionally recorded on a sound stage, the background noise is very low and the acoustic and electronic gain of the microphone is high, so there is little to no background noise in the recording. By contrast, when a reporter interviews someone of interest in the street, or when a pod-cast producer records a discussion to be posted to social media, they may use a microphone with relatively high noise levels, and capture ambient room noise, such as room air conditioner noise. This ambient noise may be effectively inaudible in the recording, especially if it is listened to in a similarly air-conditioned environment. But if the recording is processed by a dynamic range compression system, then the quiet background noise will be amplified. That amplification will raise the background noise to a level where it is no longer inaudible, and may even be unpleasant or annoying, as it will be closer in level to that of the speech component.

Previous attempts at solving this problem have focused on identifying the noise in the input signal and explicitly suppressing (gating) the noise, so that the compressor gain would be applied to silence, resulting in silence out. This is an attempt to automate the signal processing that a professional mastering engineer would do. This approach, however, has a couple of problems. For example, automatic noise detection is difficult, both in practice and theoretically. Additionally, detection algorithms typically have some latency resulting in the gating being applied too late, both when suppressing the noise and when releasing the gate when noise transitions to signal. These gate effects are usually perceptible and unpleasant. More sophisticated alternatives to gating have also been tried (e.g., spectral subtraction, for example), but these alternatives also have unwanted acoustic effects, including audible and tonal distortions.

Instead of detecting and suppressing the noise, the disclosed embodiments limit the AGC and/or DRC processing so that compression boosting is not applied to signals below a specified threshold level. That level is set below the quietest signal level that professionally produced content could reasonably expect to be heard in a typical room (e.g., an untreated room). Below that level the target gain is zero (no boost). It is not necessary to actively remove signals below the threshold as they are not audible in a typical listening environment. The gain filtering and smoothing mechanisms that are part of compression and leveling systems like Dolby Volume® will still work to smooth transitions to ensure there are no obvious discontinuities in the audio.

In an embodiment, if it is desired to continue using AGC processing to raise the level of extremely quiet signals the DRC gain is set to be the inverse of the AGC gain for signals below a low-level knee to avoid amplification of the noise by the AGC processing.

In an embodiment, the threshold below which input is considered unwanted noise is computed dynamically, with a minimum-follower mechanism, over a history of the observed audio signal.

In another embodiment, the threshold is a constant, determined empirically by ad hoc tuning to appropriately discriminate between wanted signals and unwanted signals.

In another embodiment, knowledge that the audio input is professionally-produced cinematic content (e.g., has 5.1 or more channels), or special metadata indicating professional production, can be used to defeat or deactivate the new threshold mechanism based on the assumption that the loudness leveler is tuned to professionally produced audio.

In another embodiment, a signal recognition and classification system is used to discriminate between unwanted noise and the wanted audio signal, and to adjust the position of one or more low-level knees in a DRC compression curve and the amount of gain that should be applied to audio signals below the knee(s).

In another embodiment, a voice activity detector (VAD) is used to detect speech in the audio signal. The detected speech is used to select a DRC compression curve to avoid boosting unwanted background noise.

Example System

FIG. 1 is a block diagram of a playback volume controller/leveler system 100 that avoids boosting unwanted noise, according to an embodiment. System 100 includes playback volume controller 101, AGC 102, DRC 103, constrain/combine module 104, gain adjuster 105, audio quality detector 106, and optionally DRC compression curve selector 107 and storage device 108 (e.g., flash memory).

N-channel audio is input into playback volume controller/leveler 101. In an embodiment, playback volume controller/leveler 101 is Dolby Volume®. Playback volume controller/leveler 101 is designed to even out the volume level to provide a consistent volume level while maintaining the sonic balance of the audio without audible side effects, such as distortion. The output of playback volume controller/leveler 101 is input into AGC 102 and DRC 103.

AGC 102 raises or lowers the gain of the audio on a sample-over-sample basis to keep the audio loudness centered on a given static target (hereinafter referred to as the "AGC Target" level). DRC 103 reduces the dynamic range of the audio in accordance with a DRC compression curve by lowering (compressing) the output volume level of louder segments of the audio while preserving or expanding the output volume level of quieter segments of the audio. Outputs of AGC 102 and DRC 103 are input into constrain/combine module 104.

Constraint/combine module 104 constrains and combines the gains output by AGC 102 and DRC 103, as described in reference to FIG. 3. The output of constrain/combine module 104 is a gain which is applied by gain adjuster 105 to the n-channel audio to cut or boost the n-channel audio, where n is a positive integer greater than zero.

In an embodiment, n-channel audio is input into audio quality detector 106 which determines whether the audio is professionally-produced (e.g., no unwanted background noise). For example, audio quality detector 106 determines if the n-channel audio has two or more channels (n>2) indicative of a multi-channel (e.g., surround) recording, such as 5.1 or higher, which is a surround sound format typically created by professional audio engineers for cinema applications. In another embodiment, metadata of the audio is used to determine the quality of the audio. An output of audio quality detector 106 is a signal, Boolean or data that indicates the quality of the audio. Based on this output, DRC compression curve selector 107 retrieves a suitable DRC compression curve from storage device 108 and sends it to DRC 103 so that compression is applied to the audio in accordance with the selected DRC compression curve. For example, if the audio is professionally produced, the audio is compressed in accordance with the DRM compression curve shown in FIG. 4. If, however, the audio is not professionally produced, the audio is compressed in accordance with one of the DRM compression curves shown in FIGS. 5 and 6. As used herein, a "DRC compression curve" includes downward and upward compression, where downward compression reduces loud sounds over the threshold level while quiet sounds remain unaffected, and upward compression increases the loudness of sounds below the threshold level while leaving louder sounds unaffected.

Example Noise/Noise Level Detector

Figure 2A:
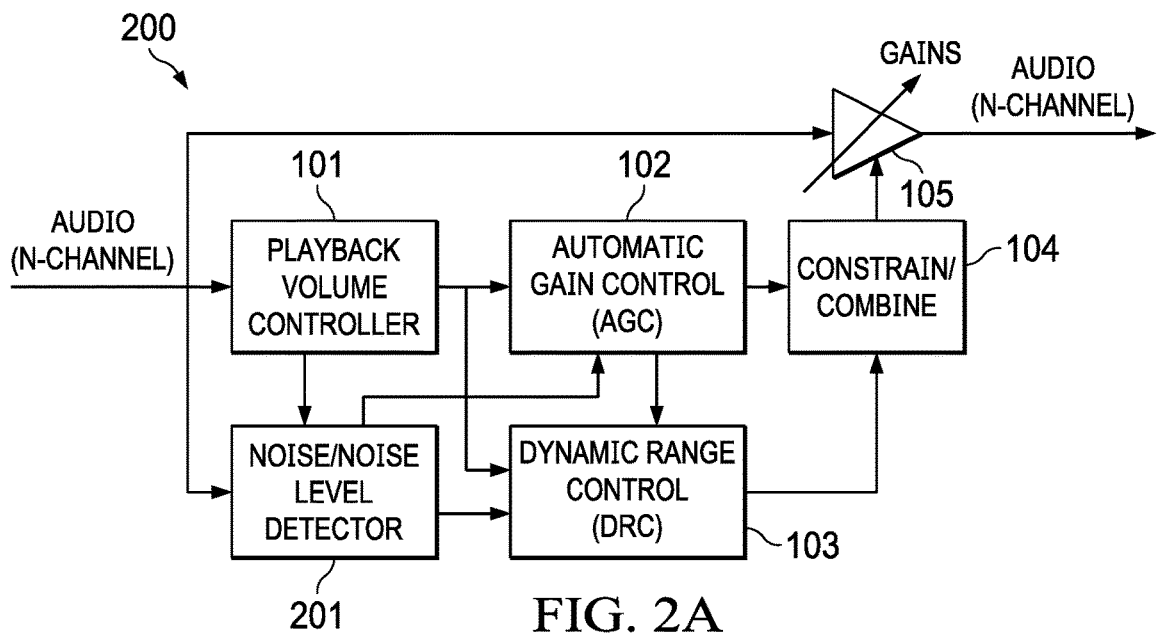
FIG. 2A is a block diagram of a playback volume controller/leveler system including a noise signal recognition and classification system, according to an embodiment.

FIG. 2A is a block diagram of playback volume controller/leveler system 200 including a noise signal recognition and classification system, according to an embodiment. System 200 includes playback volume controller/leveler 101, AGC 102, DRC 103, constrain/combine module 104, gain adjuster 105 and noise/noise level detector 201 for providing noise signal recognition and classification. Playback volume controller/leveler 101, AGC 102, DRC 103, constrain/combine module 104 and gain adjuster 105 operate as described in reference to FIG. 1 and need not described again. In an embodiment, system 200 also includes audio quality detector 106, selector 107 and storage device 108, which operate as described in reference to FIG. 1.

In an embodiment, noise/noise level detector 201 receives the n-channel audio and an auditory scene analysis (ASA) event value from the playback volume controller/leveler 101, and determines a noise floor for the audio signal using a minimum-follower mechanism and a noise possibility value to identify false noise detections. The output of noise/noise level 201 detector is used to determine whether to apply AGC and/or DRC to the output of playback volume controller/leveler and to set the threshold level below which compression boosting is not applied.

Figure 2B:
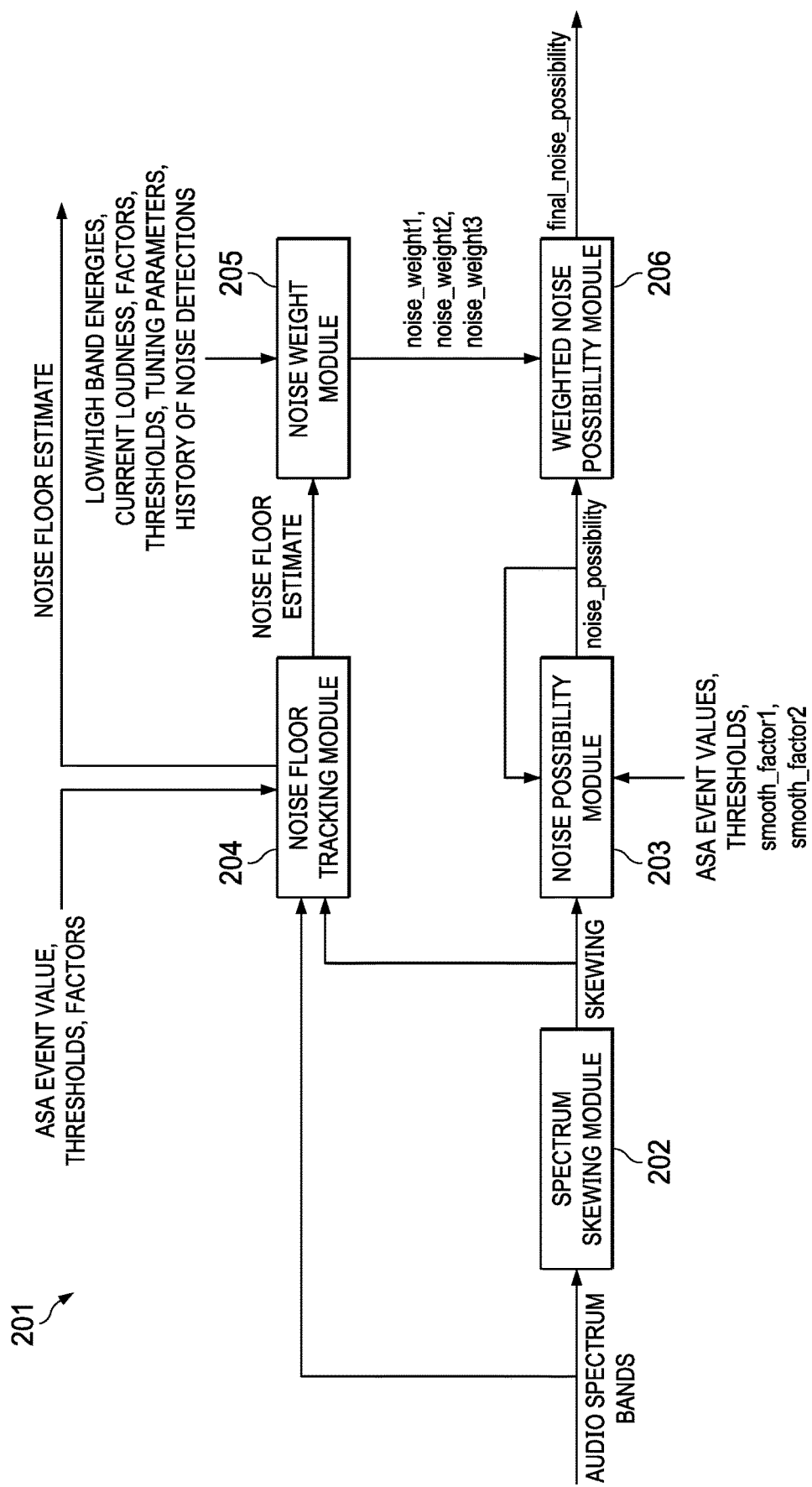
FIG. 2B is a block diagram of the noise/noise level detector of FIG. 2A, according to an embodiment.

FIG. 2B is a block diagram of noise/noise level detector 201 in FIG. 2A, according to an embodiment. Noise/noise level detector 201 includes spectrum skewness module 202, noise possibility module 203, noise floor tracking module 204, noise weight module 205 and weighted noise possibility module 206.

Spectrum skewness module 202 computes a spectrum skewness based on the spectrum bands of the audio signal. In an embodiment, a mean and standard deviation of the average energy crossing the spectrum bands is computed and used to calculate a third moment of the spectrum magnitude. The third moment, which is the spectrum skewness, quantifies the shape of the audio spectrum.

In an embodiment, noise possibility module 203 determines a noise possibility value based on the skewness of the audio spectrum and an ASA event value provided by playback volume controller/leveler 101. In an embodiment, the ASA event value is determined as described in U.S. Pat. No. 8,144,881 (the "'881 patent"). As described in the '881 patent, auditory event detection may be implemented by dividing the time domain audio signal into time intervals or blocks and then converting the data in each block to the frequency domain, using either a filterbank or a time-frequency transformation, such as the Fast Fourier Transform (FFT). The amplitude of the spectral content of each block may be normalized to eliminate or reduce the effect of amplitude changes. Each resulting frequency domain representation provides an indication of the spectral content of the audio in the particular block. The spectral content of successive blocks is compared and changes greater than a threshold may be taken to indicate the temporal start or temporal end of an auditory event.

Preferably, the frequency domain data is normalized. The degree to which the frequency domain data needs to be normalized gives an indication of amplitude. Hence, if a change in this degree exceeds a predetermined threshold that too may be taken to indicate an event boundary. Event start and end points resulting from spectral changes and from amplitude changes may be ORed together so that event boundaries resulting from either type of change are identified.

In an embodiment, noise/noise level detector 201 determines a noise possibility value (noise_possibility) using the following logic.

counter=0
If (ASA event value<event_threshold and skewness<skewness_threshold)
{
  If (ASA event value<last frame ASA event value)
  {
    counter++
  }
}
If (counter>counter_threshold)
{
  noise_possibility=last frame noise_possibility*smooth_factor1+(1−smooth_factor1)*1
}
Else
{
  noise_possibility=last frame noise_possibility*smooth_factor2
}

According to the logic above, a counter ("counter") is initialized to zero. If the ASA event value is less than an event_threshold, the spectrum skewness is less than a skewness_threshold, and the ASA event value is less than the last frame ASA event value, counter is incremented by one. Otherwise, counter is not incremented. If counter is greater than counter_threshold, noise_possibility value is equal to the last frame noise_possibility value multiplied by a first smoothing factor (smooth_factor1) plus one minus smooth_factor1 multiplied by the integer 1. Otherwise, the noise_possibility value is equal to the last frame noise_possibility value multiplied by a second smoothing factor (smooth_factor2). In an embodiment, the counter_threshold corresponding time is ~0.1 s, which is acceptable delay for playback. The thresholds and smoothing factors described above can be determined and tuned empirically. In an embodiment, the noise_possibility value can be weighted to reduce false positives, as described in further detail below.

In an embodiment, noise floor tracking module 204 tracks the noise floor of the audio signal. The estimated noise floor is used to set the threshold level below which compression boosting is not performed. The noise floor is also used to compute a signal-to-noise ratio (SNR) value for weight calculation, as described in further detail below. Traditional minimal tracking algorithms (herein, also referred to as a "minimum-follower") typically estimate a noise floor for music or cinema content that is too high. An improved solution tracks the minimal value of each spectrum band as the noise floor and resets the minimal value when a reset flag is detected. The logic for computing and resetting the minimal value is as follows.

If (ASA event value<track_back_asa_threshold and skewness<track_back_skewness_threshold)
{
  minimal value of each band=minimal value of each band*f1+f2*current band's value
}
If (current frame's energy<silence_threshold) {reset the minimal value}

The condition statement (ASA event value<track_back_asa_threshold and skewness<track_back_skewness_threshold) allows for fast tracking of the noise floor when the audio content switches from professionally produced content to non-professionally produced content (e.g., mobile recorded content). The minimal value of each band is usually reset when professional content is playing or content playback is paused/stopped. In this time period, the content is more like silence. The reset operation allows for the fast tracking of the noise floor on the switched content scenario. In an embodiment, the minimal value of each band is used as the threshold value below which compression boosting is not performed, as described in reference to FIG. 1. The factors f1 and f2 and thresholds described above can be determined empirically.

In an embodiment, noise weight calculation module 205 determines the difference in energy between a low frequency band (e.g., around 100 Hz) and a high frequency band (e.g., around 1 kHz). For most non-professionally produced content, the envelope of unwanted noise has a stable roll-off. For intended noise in professionally produced content the roll-off is not stable.

In an embodiment, the difference in the low and high frequency bands (diff_energy) is given by diff_energy=low band energy−high band energy. A sigmoid function S(•) is used to determine a first noise weight (noise_weight1), using the following logic: noise_weight1=S((diff_energy−diff_threshold)*k1), where the diff_threshold is a tuning parameter and k1 is a factor used to control the switch speed.

In an embodiment, noise weight module 205 determines a second noise weight (noise_weight2) based on the SNR of the audio signal. The SNR is a useful measure to determine whether the content is professional or non-professional, and in particular the SNR is useful to determine if the noise is present in low quality content or high quality content. In an embodiment, the SNR is determined as the ratio of the current loudness of the audio signal divided by the minimal tracked noise loudness output by noise floor tracking module 204. The sigmoid function S(•) is used to determine noise_weight2 using the following logic: noise weight2=S((SNR−snr_threshold)*k2), where snr_threshold is tuning parameter and k2 is the factor use to control switch speed.

The weighted noise_possibility value (noise_possibility_w) is given by: noise_possibility_w=noise_possibility*noise_weight1*noise_weight2, which is used to reduced false positive noise detections.

In an embodiment, detected noise history is used as a long time mechanism to further reduce false positive noise detections on professionally produced content. False positive noise detection can still occur when playing back professional produced content that has several seconds of very low level background sound, such as a television snowflake sound, old turntable noise, etc. The following logic determines a third noise weight (noise_weight3) for the noise_possibility value as follows:

noise_count=count of noise_possibility>threshold_high in the last N seconds
non_noise_count=count of noise_possibility<threshold_low in the last N seconds
If (noise_count*f3<non_noise_count)
{
  noise_weight3=last_frame_noise_weight3*fade_factor
}
Else
{
  noise_weight3=last_frame_noise_weight3*F4+F5
}
  final_noise_possibility=noise_possibility_w*noise_weight3

In an embodiment, fade factor is used to decrease the noise possibility and is determined empirically. The time period N and the factors f3, f4 and f5 are determined empirically. If the condition (noise_count*f1<non_noise_count) is true, the content is assumed to be professionally produced content.

Example DRM Compression Curves

FIG. 3 is a plot of output loudness versus input loudness illustrating the effects of AGC and DRC on output audio loudness, according to an embodiment. Dotted line 301 illustrates the linear relationship between the input loudness (log sone) and the output loudness (log sone) of the audio signal in the absence of AGC and DRC processing. AGC curve 302 illustrates the progressive gain ("AGC boost") applied to signals below the AGC Target level 303, and the progressive attenuation ("AGC cut") applied to signals with level above AGC Target level 303. DRC curve 304 defines band 305 around AGC Target 303 where the signal is not changed, but signals louder than a first threshold T2 have an attenuation ("DRC cut") applied to them, and signals quieter than a second threshold T1 have a gain ("DRC boost") applied to them. This resulting output level is closer to AGC Target level 303 for all input levels than the original input audio signal.

Figure 4:
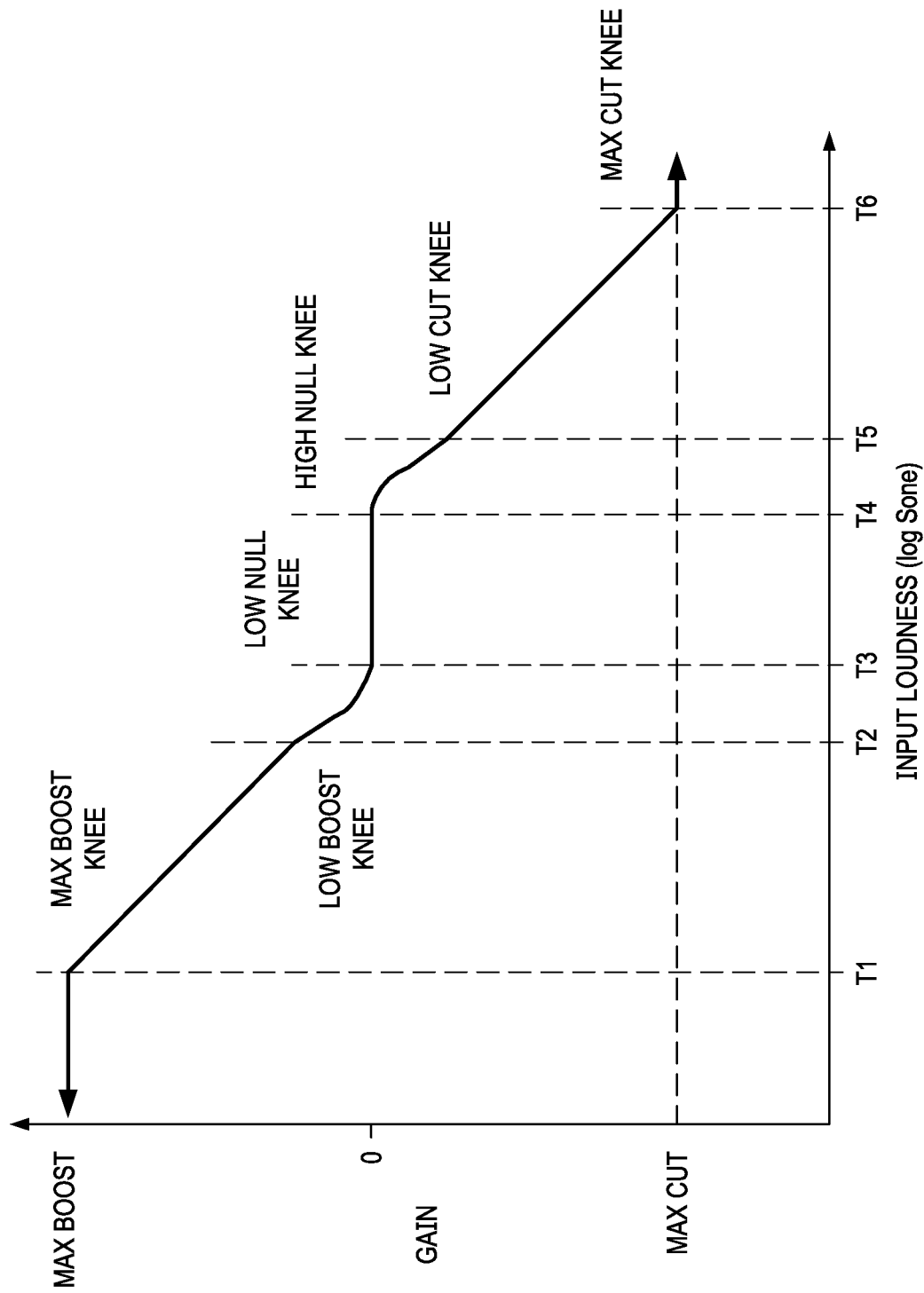
FIG. 4 is a plot of the DRC boost and DRC cut components from FIG. 1, normalized to zero gain around the operating point, according to an embodiment.

FIG. 4 is a plot of a DRC curve showing DRC boost and DRC cut components from FIG. 3, normalized to zero gain around the operating point, according to an embodiment. As the loudness of the input signal increases different knees (e.g., hard knees or soft knees) are applied as shown. For example, for input loudness below T1 a maximum boost knee is applied to the audio signal, for input loudness between T1 and T2 a low boost knee is applied to the audio signal, for input loudness between T2 and T3 a low null knee is applied to the audio signal, for input loudness between T3 and T4 no DRC processing is performed, for input loudness between T4 and T5 a high null knee is applied to the audio signal, for input loudness between T5 and T6 a low cut knee is applied to the audio signal and for input loudness greater than T6 a maximum cut knee is applied to the audio signal. As can be observed from FIG. 4, signals below T1 are boosted. If the audio includes background noise (e.g., air conditioner noise), the noise will be boosted by the maximum boost knee, amplifying the noise so that it is audible to the listener. To address this issue an extra knee is added to the DRC curve of FIG. 4 as shown in FIG. 5.

Figure 5:
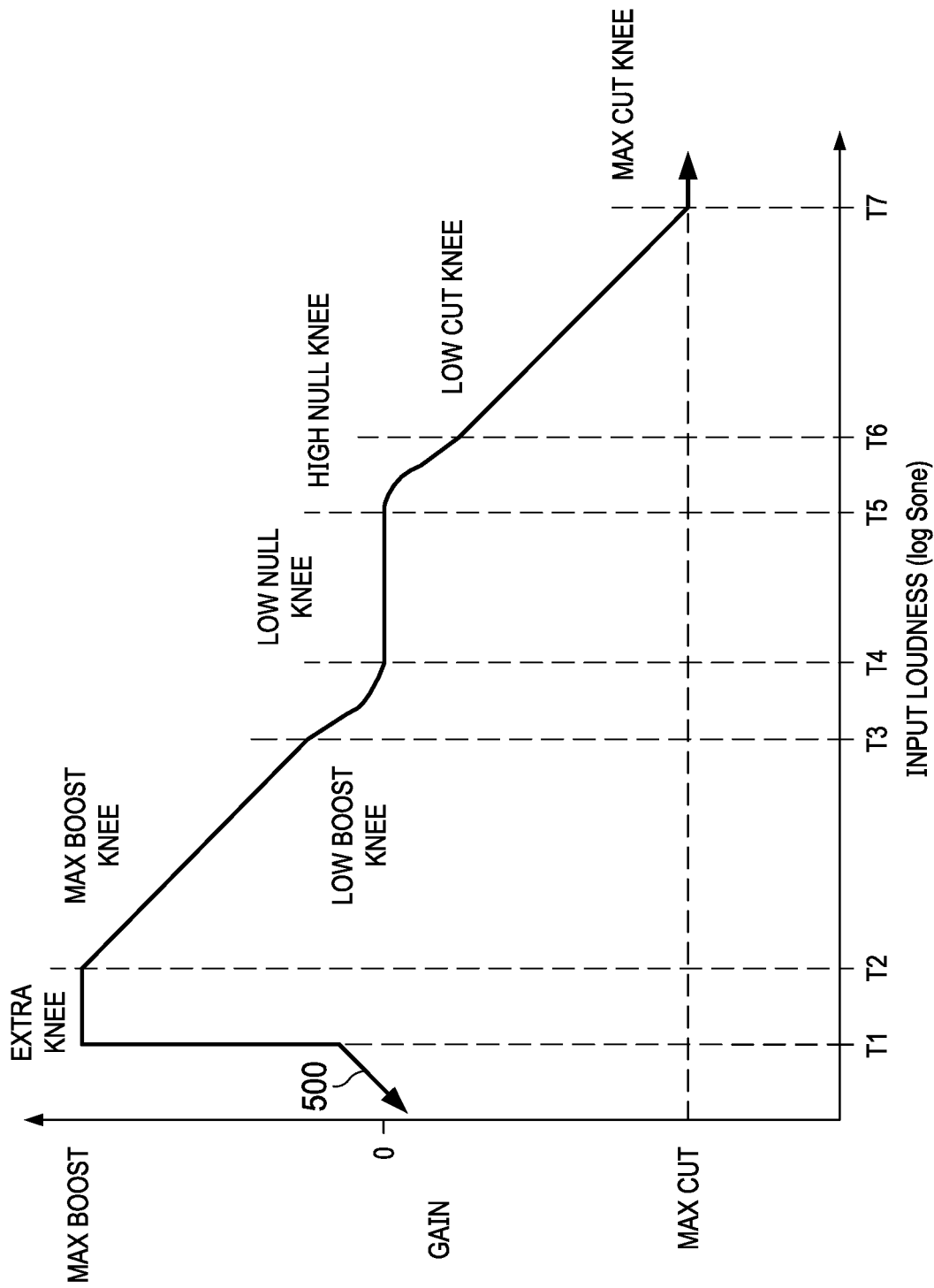
FIG. 5 is a variation of the DRC gain curve of FIG. 2, illustrating an extra knee at low signal levels that is introduced to avoid boosting unwanted background noise, according to an embodiment.

FIG. 5 is a variation of the DRC gain curve of FIG. 2, illustrating extra knee 500 at low signal levels to avoid boosting background noise, according to an embodiment. As shown, no gain (boost) is applied to input signals with loudness lower than T1 to avoid compression boosting unwanted background noise. In the embodiment shown, there is a slight progressive boost of signals below T1 so that quieter signals are still slightly boosted. The slope of the ramp can be determined empirically. In an embodiment, the threshold level T1 is set below the quietest signal level that professionally produced content could reasonably expect to be heard in a typical room (e.g., an untreated room). Below that level, the target gain is zero (no boost) or the target gain is a ramp to provide a progressive boost. Note that it is not necessary to actively remove background noise below the threshold (e.g., using filtering) as the background noise is not audible in a typical listening environment without boosting. The gain filtering and smoothing mechanisms that are part of compression and leveling systems applied in playback volume controller/leveler 101 (e.g., Dolby Volume®) will still work to smooth transitions to ensure there are no obvious discontinuities in the audio.

In an embodiment, if it is desired to continue using AGC processing to raise the level of extremely quiet signals the DRC gain is set to be the inverse of the gain provided by AGC 102 for signals below the low-level knee 500 to avoid boosting unwanted background noise.

In an embodiment, the threshold level below which input audio is considered to include unwanted background noise is computed dynamically using a minimum-follower mechanism over a history of the observed signal. For example, the audio signal is processed by a filterbank (e.g., Modified Discreet Cosine Transform (MDCT), Quadrature Mirror Filter (QMF)) to produce multiple subbands, and then the average minimum energy (lowest non-zero energy) across subbands over time is computed and used to compute the threshold level, as described in reference to the noise floor tracking module 204 of FIG. 2B.

In an embodiment, the threshold level is a constant determined empirically by ad hoc tuning to appropriately discriminate between wanted audio signals and unwanted background noise using reference audio.

In an embodiment, knowledge that the audio is professionally-produced cinematic audio content (e.g., has 5.1 or more channels), or special metadata indicating professional production, is used to select a default DRC compression curve which is designed to be used on professionally produced audio.

In an embodiment, a voice activity detector (VAD) (not shown) is used to detect speech in the audio. The detected speech is used to select a DRC compressor curve to avoid boosting unwanted background noise, such as, for example, one of the DRC compression curves shown in FIGS. 5 and 6. In an embodiment, the VAD and audio quality detector are used together to determine which DRC compression curve to apply to the audio.

Figure 6:
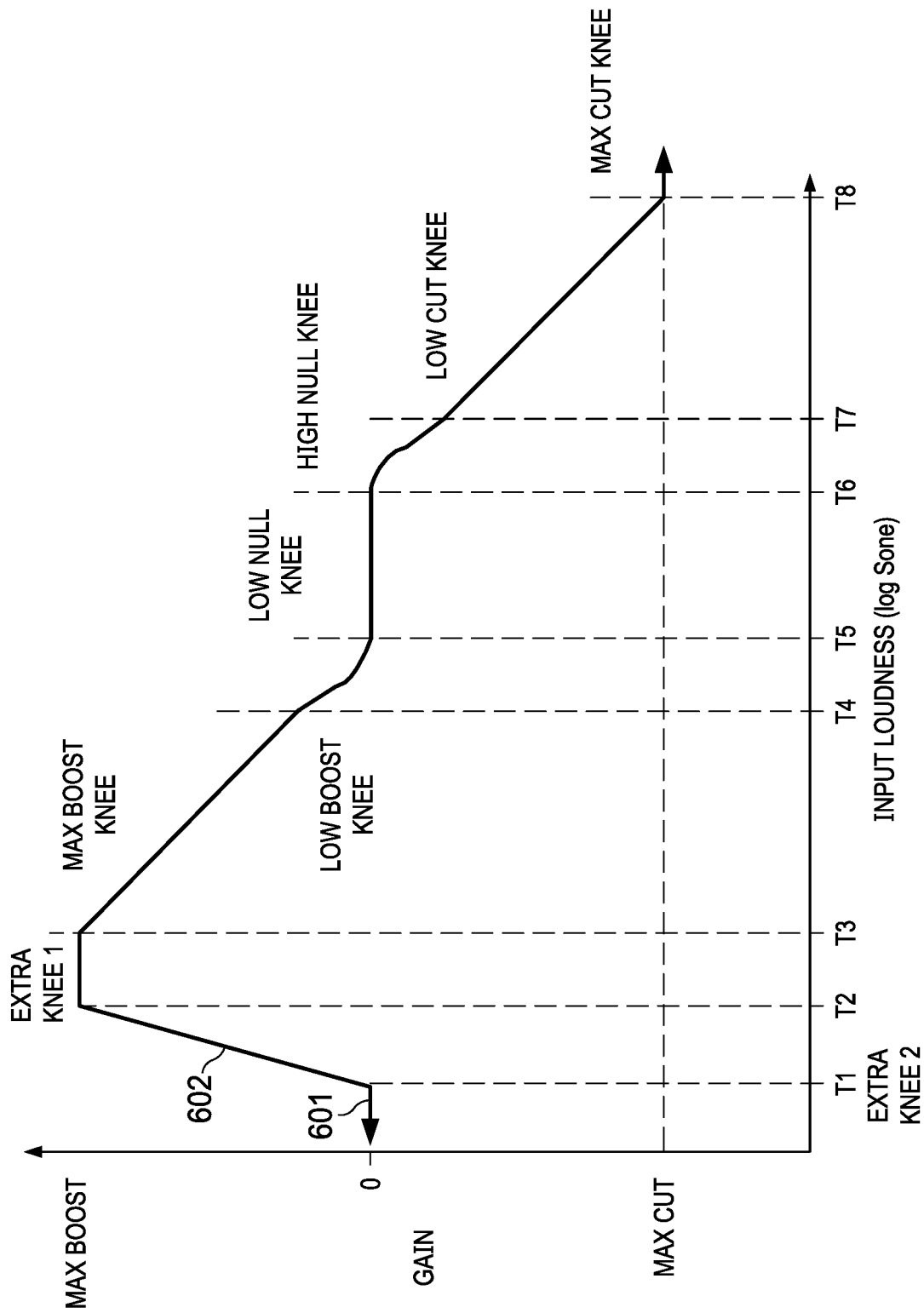
FIG. 6 is a variation of the DRC gain curve of FIG. 5, illustrating two extra knees at low signal levels that has been introduced to avoid boosting background noise, according to an embodiment.

FIG. 6 is a variation of the DRC gain curve of FIG. 5, illustrating two extra knees 601, 602 at low signal levels that have been introduced to avoid boosting background noise, according to an embodiment. In this embodiment, input signals with loudness below T1 are not boosted and input signals with loudness between T1 and T2 are progressively boosted along a ramp to a maximum gain. The ramp helps avoid a large and sudden jump in output volume.

Example Processes

Figure 7:
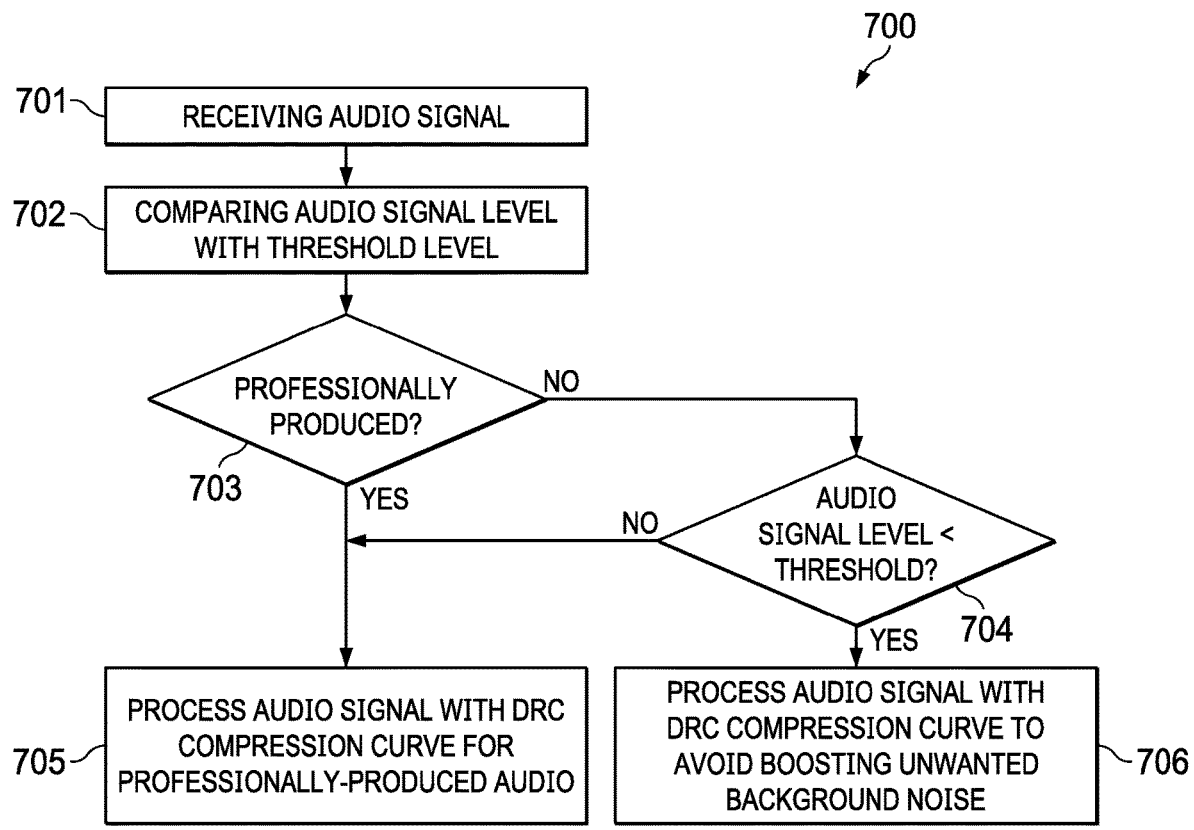
FIG. 7 is a flow diagram of a process that applies a DRC compressor curve to avoid boosting unwanted background noise, according to an embodiment.

FIG. 7 is a flow diagram of process 700 that uses a compressor target curve to avoid boosting unwanted background noise, according to an embodiment. Process 700 can be implemented by, for example, hardware architecture 800 described in reference to FIG. 8.

Process 700 begins by receiving n-channel audio (701). In an embodiment, the n-channel audio is output by a playback volume controller/leveler, such as Dolby Volume®, which evens out the volume of the audio to provide a consistent volume level while maintaining the sonic balance of the audio without audible side effects, such as distortion.

Process 700 continues by comparing the audio with a threshold level (702). In an embodiment, the threshold level is a constant determined empirically (e.g., in the range of −30 dB to −60 dB from full scale). In an embodiment, the threshold is determined using signal identification and classification, such as noise level detector 201 described in reference to FIG. 2. In an embodiment, a minimum-follower mechanism is used to determine the threshold level that uses an average minimum energy across subbands to compute the threshold level.

Process 700 continues by determining whether the audio is professionally produced (703). For example, in an embodiment the number of channels are counted to see if the number of channels exceed two channels based on the assumption that any mix having three or more channels is likely a professionally-produced surround sound audio. In an embodiment, metadata of the audio is examined to determine if the audio is professionally produced.

In accordance with the input audio being professionally produced, the audio is processed with a DRC compression curve designed for professionally produced audio (705), such as the DRC compression curve shown in FIG. 4, which does not include an extra knee due to the low risk of boosting unwanted background noise in a professional recording. This allows playback volume controller/leveler 101 to operate as designed for professionally-produced audio, such as cinematic content in multi-channel formats (e.g., 5.1 or higher). Additionally, in accordance with the input audio not being professionally produced and the level being greater than the threshold value (704), the audio is processed with the DRC compression curve shown in FIG. 4.

In accordance with the input audio not being professionally produced and having a level that is less than the threshold level, the audio is processed with a DRC compression curve designed to avoid boosting unwanted background noise in non-professional recordings (706), such as the DRC compression curves shown in FIG. 5 or 6, which include one or two extra knees, respectively, to lower the risk of boosting unwanted background noise in the audio, such as air conditioner noise. In other embodiments, more than two knees can be used.

Figure 8:
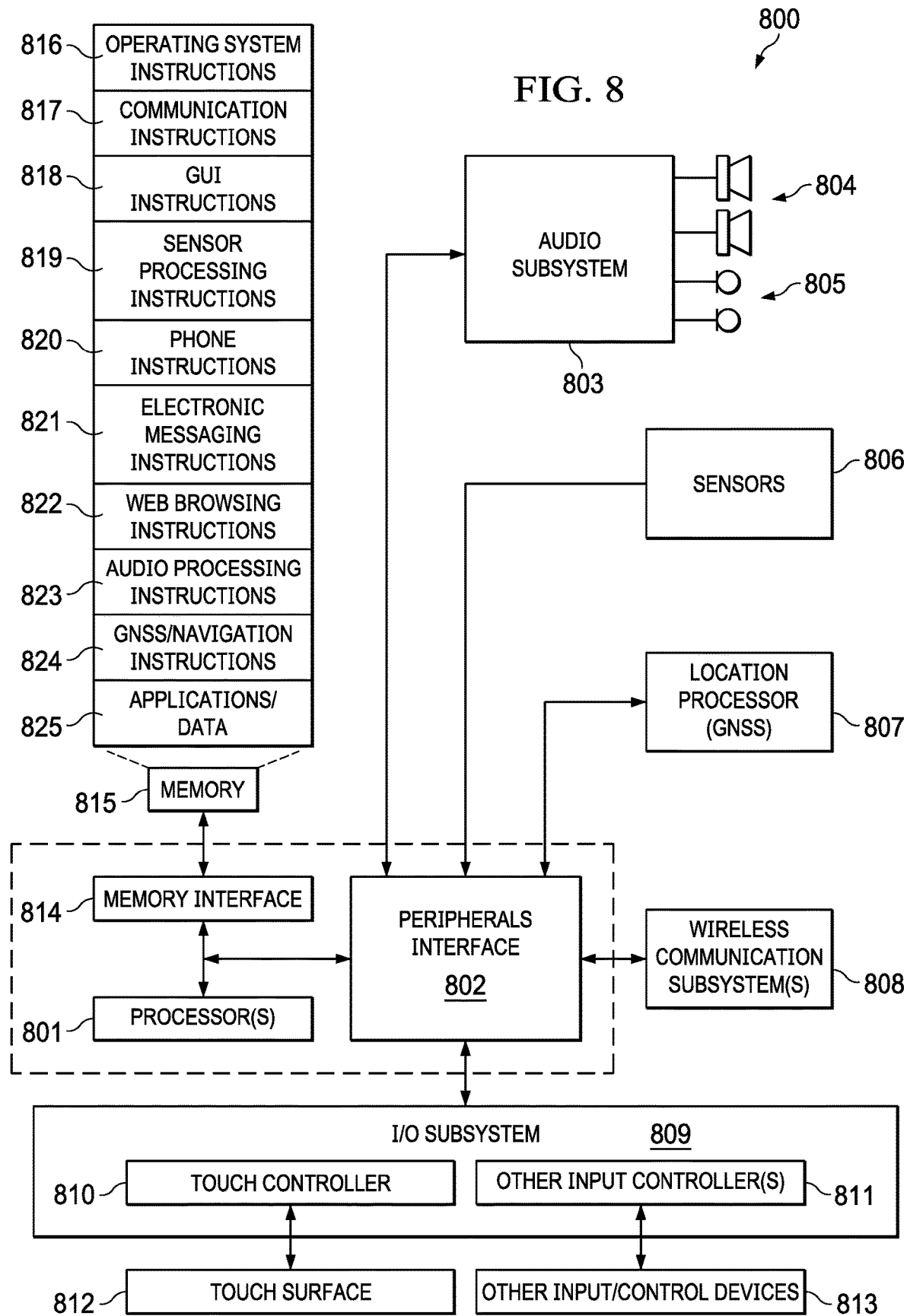
FIG. 8 is a system architecture for implementing the features and processes described in reference to FIGS. 1-7, according to an embodiment.

FIG. 8 is a hardware architecture for implementing the features and processes described in reference to FIGS. 1-7, according to an embodiment. Architecture 800 can be implemented in any electronic device, including but not limited to: a desktop computer, consumer audio/visual (AV) equipment, radio broadcast equipment, mobile devices (e.g., smartphone, tablet computer, laptop computer, wearable device). In the example embodiment shown, architecture 800 is for a smart phone and includes processor(s) 801, peripherals interface 802, audio subsystem 803, loudspeakers 804, microphone 805, sensors 806 (e.g., accelerometers, gyros, barometer, magnetometer, camera), location processor 807 (e.g., GNSS receiver), wireless communications subsystems 808 (e.g., WiFi, Bluetooth, cellular) and I/O subsystem(s) 809, which includes touch controller 810 and other input controllers 811, touch surface 812 and other input/control devices 813. Other architectures with more or fewer components can also be used to implement the disclosed embodiments.

Memory interface 814 is coupled to processors 801, peripherals interface 802 and memory 815 (e.g., flash, RAM, ROM). Memory 815 stores computer program instructions and data, including but not limited to: operating system instructions 816, communication instructions 817, GUI instructions 818, sensor processing instructions 819, phone instructions 820, electronic messaging instructions 821, web browsing instructions 822, audio processing instructions 823, GNSS/navigation instructions 824 and applications/data 825. Audio processing instructions 823 include instructions for performing the audio processing described in reference to FIGS. 1-7.

Aspects of the systems described herein may be implemented in an appropriate computer-based sound processing network environment for processing digital or digitized audio files. Portions of the adaptive audio system may include one or more networks that comprise any desired number of individual machines, including one or more routers (not shown) that serve to buffer and route the data transmitted among the computers. Such a network may be built on various different network protocols, and may be the Internet, a Wide Area Network (WAN), a Local Area Network (LAN), or any combination thereof.

One or more of the components, blocks, processes or other functional components may be implemented through a computer program that controls execution of a processor-based computing device of the system. It should also be noted that the various functions disclosed herein may be described using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, physical (non-transitory), non-volatile storage media in various forms, such as optical, magnetic or semiconductor storage media.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of processing an audio signal, comprising:
receiving audio from a playback volume controller/leveler;
comparing a level of the audio with a threshold level;
determining whether the audio is professionally produced
in accordance with the audio being professionally produced or the level being greater than the threshold level,
boosting or cutting the audio in accordance with a first dynamic range control (DRC) compression curve, the first DRC compression curve indicating a first amount of gain to apply to the audio;
in accordance with the audio not being professionally produced and the level being less than or equal to the threshold level,
boosting or cutting the audio in accordance with a second DRC compression curve, the second DRC compression curve indicating a second amount of gain to apply to the audio, wherein the second amount of gain is different than the first amount of gain; and
sending the audio to a downstream device.

2. The method of claim 1, wherein the second amount of gain is zero.

3. The method of claim 1, wherein the threshold level is a constant.

4. The method of claim 3, wherein the threshold level is in a range of about −30 dB to about −60 dB from full scale.

5. The method of claim 1, wherein determining whether the audio is professionally produced further comprises determining whether a number of channels of the audio is greater than two.

6. The method of claim 1, wherein determining whether the audio signal is professionally produced further comprises determining from metadata of the audio whether the audio signal is professionally produced.

7. The method of claim 1, wherein the downstream device includes at least one of an audio processor, a storage device or an output device.

8. The method of claim 1, wherein the second amount of gain is set to an inverse of automatic gain control (AGC) gain applied to the audio below a low-level knee in the second DRC compression curve to avoid boosting unwanted noise by the AGC.

9. The method of claim 1, further comprising:
detecting, using a voice activity detector (VAD), speech in the audio signal, and using the detected speech at least in part to select the second DRC compression curve.

10. A system comprising:
one or more processors; and
a non-transitory computer-readable medium storing computer instructions that, when executed by the one or more processors, cause the one or more processors to perform operations claim 1.

11. A non-transitory, computer-readable medium storing computer instructions that, when executed by one or more processors, cause the one or more processors to perform operations of claim 1.

12. A method of processing an audio signal, comprising:
receiving audio from a playback volume controller/leveler;
computing a threshold level dynamically using a minimum-follower mechanism over a history of observed audio signals by:
computing a frequency spectrum of the audio, the frequency spectrum having a plurality of subbands;
computing an average minimum energy across the subbands over time; and
computing the threshold level based at least in part on the average minimum energy;
comparing a level of the audio with the threshold level;
in accordance with the level being greater than the threshold level,
processing the audio in accordance with a first dynamic range control (DRC) compression curve, the first DRC compression curve indicating a first amount of gain to apply to the audio;
in accordance with the level being less than or equal to the threshold level,
processing the audio in accordance with a second DRC compression curve, the second DRC compression curve indicating a second amount of gain to apply to the audio, wherein the second amount of gain is different than the first amount of gain; and
sending the audio to a downstream device.

13. The method of claim 12, wherein the second amount of gain is set to an inverse of automatic gain control (AGC) gain applied to the audio below a low-level knee in the second DRC compression curve to avoid boosting unwanted noise by the AGC.

14. The method of claim 12, further comprising:
detecting, using a voice activity detector (VAD), speech in the audio signal, and using the detected speech at least in part to select the second DRC compression curve.

15. A system comprising:
one or more processors; and
a non-transitory computer-readable medium storing computer instructions that, when executed by the one or more processors, cause the one or more processors to perform operations claim 12.

16. A non-transitory, computer-readable medium storing computer instructions that, when executed by one or more processors, cause the one or more processors to perform operations of claim 12.

17. A method of processing an audio signal, comprising:
receiving audio from a playback volume controller/leveler;
discriminating, using signal recognition and classification, between unwanted noise and wanted signal in the audio;
modifying a first or a second dynamic range control compression (DRC) curve, the first DRC compression curve indicating a first amount of gain to apply to the audio and the second DRC compression curved indicating a second amount of gain to apply to the audio, wherein the second amount of gain is different than the first amount of gain, by adjusting, based on the discriminating, a position of one or more knees in the first or the second dynamic range control (DRC) compression curve, and an amount of gain applied to the audio when a level of the audio is below the one or more knees;
comparing the level of the audio with a threshold level;
in accordance with the level of the audio being greater than the threshold level,
processing the audio in accordance with the first DRC compression curve;
in accordance with the level being less than or equal to the threshold level,
processing the audio in accordance with the second DRC compression curve; and
sending the audio to a downstream device.

18. The method of claim 1, further comprising:
detecting, using a voice activity detector (VAD), speech in the audio signal, and using the detected speech at least in part to select the second DRC compression curve.

19. A system comprising: one or more processors; and a non-transitory computer-readable medium storing computer instructions that, when executed by the one or more processors, cause the one or more processors to perform operations of claim 17.

20. A non-transitory, computer-readable medium storing computer instructions that, when executed by one or more processors, cause the one or more processors to perform operations of claim 17.

* * * * *

UNITED STATES PATENT AND TRADEMARK OFFICE
CERTIFICATE OF CORRECTION

PATENT NO. : 11,894,006 B2
APPLICATION NO. : 17/263020
DATED : February 6, 2024
INVENTOR(S) : Zhongjin Wang, Andrew P. Reilly and Michael William Mason Page 1 of 1

It is certified that error appears in the above-identified patent and that said Letters Patent is hereby corrected as shown below:

In the Claims

Column 13, Line 44, In Claim 10, after "operations", insert --of--

Column 14, Line 24, In Claim 15, after "operations", insert --of--

Column 14, Line 36, In Claim 17, delete "compression (DRC)" and insert --(DRC) compression-- therefor Column 14, Line 39, In Claim 17, delete "curved" and insert --curve-- therefor Column 14, Line 63, In Claim 19, after "comprising:", insert --¶--

Column 14, Line 63, In Claim 19, after "and", insert --¶--

Signed and Sealed this
Eighth Day of July, 2025

Coke Morgan Stewart
*Acting Director of the United States Patent and Trademark Office*